(12) United States Patent
Seo (10) Patent No.: US 9,105,513 B2
(45) Date of Patent: Aug. 11, 2015

(54) TRANSISTOR INCLUDING SUB-GATE AND SEMICONDUCTOR DEVICE INCLUDING THE SAME

(71) Applicant: SK hynix Inc., Icheon-si, Gyeonggi-do (KR)

(72) Inventor: Moon Sik Seo, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/250,012

(22) Filed: Apr. 10, 2014

(65) Prior Publication Data

US 2015/0123182 A1    May 7, 2015

(30) Foreign Application Priority Data

Nov. 1, 2013 (KR) .......................... 10-2013-0132087

(51) Int. Cl.
*H01L 27/115* (2006.01)
*H01L 29/788* (2006.01)
*H01L 29/66* (2006.01)

(52) U.S. Cl.
CPC .... *H01L 27/11578* (2013.01); *H01L 27/11551* (2013.01); *H01L 29/66825* (2013.01); *H01L 29/788* (2013.01)

(58) Field of Classification Search
CPC ............. H01L 27/11517; H01L 27/11578; H01L 27/1151; H01L 29/788; H01L 29/66825

USPC .................................................. 257/314–316
See application file for complete search history.

(56) References Cited

U.S. PATENT DOCUMENTS

| | | | | | |
|---|---|---|---|---|---|
| 5,973,356 | A | * | 10/1999 | Noble et al. ................... | 257/319 |
| 6,124,729 | A | * | 9/2000 | Noble et al. ................... | 326/41 |
| 7,859,066 | B2 | * | 12/2010 | Kito et al. ..................... | 257/411 |
| 2013/0146960 | A1 | * | 6/2013 | Sakui ............................ | 257/314 |
| 2014/0203344 | A1 | * | 7/2014 | Hopkins et al. ............... | 257/316 |
| 2014/0264532 | A1 | * | 9/2014 | Dennison et al. ............. | 257/316 |
| 2014/0264533 | A1 | * | 9/2014 | Simsek-Ege et al. ......... | 257/316 |
| 2014/0291747 | A1 | * | 10/2014 | Simsek-Ege et al. ......... | 257/316 |

FOREIGN PATENT DOCUMENTS

| KR | 1019940010346 A | 5/1994 |
|---|---|---|
| KR | 101153010 B1 | 5/2012 |
| KR | 1020120053329 A | 5/2012 |

* cited by examiner

Primary Examiner — Nathan Ha
(74) Attorney, Agent, or Firm — William Park & Associates Ltd.

(57) ABSTRACT

Provided is a semiconductor device including a pillar, a gate electrode having a first conductive pattern surrounding the pillar and a plurality of second conductive patterns which protrude from the first conductive pattern and are arranged to be spaced apart from each other, and an insulating pattern interposed between the pillar and the first conductive pattern.

20 Claims, 9 Drawing Sheets

TRANSISTOR INCLUDING SUB-GATE AND SEMICONDUCTOR DEVICE INCLUDING THE SAME

CROSS-REFERENCE TO RELATED APPLICATION

The present application claims priority to Korean patent application number 10-2013-0132087 filed on Nov. 1, 2013, in the Korean Intellectual Property Office, the entire disclosure of which is incorporated by reference herein.

BACKGROUND

1. Technical Field

Embodiment of the present disclosure relates to a transistor and an electronic device including the same, and more particularly, to a transistor and a semiconductor device including the same.

2. Related Art

Recently, as size of electronic devices is smaller, with lower power consumption, higher performance, and with increased diversity, research into further improving their properties and increasing their data storage capacity continues. In particular, such electronic devices include transistors having various functions, such as memory cell transistors, driving transistors, etc., and various structures and materials for improving properties of these transistors have been proposed.

However, when the transistors are arranged on a substrate in 2-dimensions, properties of the transistors are degraded due to interference between horizontally adjacent transistors. In addition, when transistors are stacked on a substrate in 3-dimensions, their properties are degraded by interference between adjacent transistors in the direction of stacking.

SUMMARY

According to an embodiment, a transistor includes a pillar, a gate electrode having a first conductive pattern surrounding the pillar and a plurality of second conductive patterns which protrude from the first conductive pattern and are arranged to be spaced apart from each other, and an insulating pattern interposed between the pillar and the first conductive pattern.

According to an embodiment, a transistor includes a plurality of stacked main gates with an opening part configured to pass through the plurality of main gates, a sub-gate formed in the opening part and configured to connect the plurality of main gates, and a channel layer formed in the opening part.

According to an embodiment, a semiconductor device includes a plurality of first conductive layers which are stacked with a first opening part configured to pass through the plurality of first conductive layers, a pillar formed in the first opening part, and a second conductive layer formed in the first opening part while surrounding the pillar and configured to connect the plurality of first conductive layers.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The present invention will be described more fully hereinafter with reference to the accompanying drawings, in which exemplary embodiments of the invention are shown. This invention may, however, be embodied in different forms and should not be construed as limited to the embodiments set forth herein.

Preferred embodiments of the present invention will be described below. In the drawings, elements and regions are not drawn to scale and their sizes and thicknesses may be exaggerated for clarity. In the description of the present invention, known configurations that are not central to the principles of the present invention may be omitted. Throughout the drawings and corresponding description, components are denoted by the same respective reference numerals.

Figure 1:
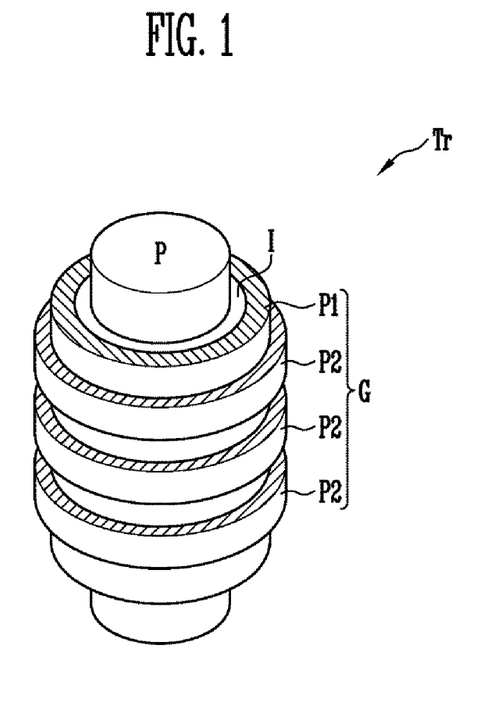
FIG. 1 is a perspective view illustrating a structure of a transistor in accordance with embodiments of the present invention.

As shown in FIG. 1, a transistor Tr may include a pillar P, an insulating pattern I and a gate electrode G. A structure of the transistor Tr may be applied to various types of transistors included in electronic devices. For example, the transistor Tr may be a selection transistor, a memory cell transistor, a driving transistor, etc., which are included in semiconductor memory devices.

The gate electrode G may include a first conductive pattern P1 surrounding the pillar P and a plurality of second conductive patterns P2 protruding from the first conductive pattern P1. The second conductive patterns P2 are arranged so as to surround the first conductive pattern P1 and be spaced apart from each other. Here, the first conductive pattern P1 may be interposed between the pillar P and the second conductive patterns P2 and connect the second conductive patterns P2 to each other. Although not shown in FIG. 1, insulating layers may be interposed between the stacked second conductive patterns P2.

The pillar P may be formed to pass through the gate electrode G, a cross-section structure of the pillar P may have various shapes such as a circle, an oval, a quadrangle, a polygon, etc., and the pillar P may have a solid center, a hollow center, or a combination thereof. The hollow center region of the pillar P may be filled with an insulating layer (not shown in FIG. 1). For example, the pillar P may include a material in which can be formed a channel of the transistor, such as, semiconductor pattern or a conductive pattern._

The insulating pattern I may be a gate insulating layer for insulating the pillar P and the gate electrode G. For example, the insulating pattern I may be an oxide layer or a memory layer, etc. If the memory layer may be used as the insulating pattern I, the memory layer may include at least one of a tunnel insulating layer, a data storage layer and a charge blocking layer. Here, the data storage layer may include at least one of a floating gate having a poly-silicon layer, etc., a electric charge trap layer having a nitride layer, etc., a nano-dot, and a phase change material layer.

In the structure described above, the first conductive pattern P1 and the second conductive pattern P2 composed of the gate electrode G of one transistor Tr may be electrically connected. Therefore, when the transistor is driven, the same voltage may be applied to the first conductive pattern P1 and the second conductive pattern P2. If the gate electrode G includes only the second conductive patterns P2 without the first conductive pattern P1, the pillar P may have a different resistance value between a region corresponding to the second conductive patterns P2 and a region corresponding to a space between the stacked second conductive patterns P2. While, by forming the first conductive pattern P1, a uniform electric field may be provided to the pillar P. Therefore, a swing property of the transistor can be improved, and properties of electronic devices having the transistor can be improved.

FIGS. 2A to 2D are cross-sectional views for describing a manufacturing method of a semiconductor device having a transistor in accordance with embodiments of the present invention. The following description of exemplary embodiments relates to the case in which the transistor described with reference to FIG. 1 is applied to a selection transistor.

Figure 2A:
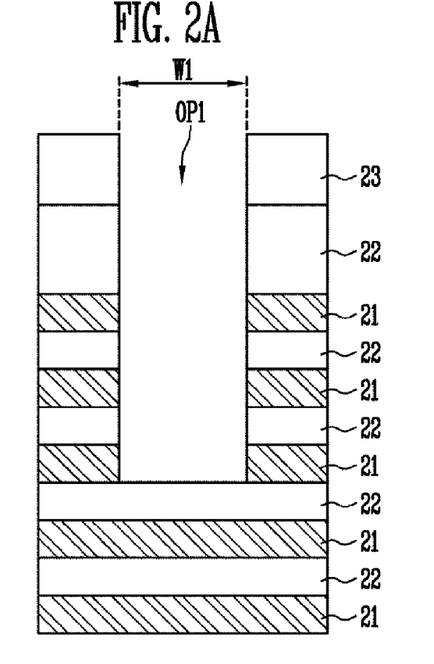
FIGS. 2A to 2D are cross-sectional views for describing a method of manufacturing a semiconductor device having a transistor in accordance with embodiments of the present invention.

As shown in FIG. 2a, a plurality of first material layers 21 and a plurality of second material layers 22 may be alternately formed. The first material layers 21 may be a conductive layer for a gate. For example, the uppermost at least one of the first material layers 21 may be a gate of selection transistor, and other first material layers 21 may be gates of memory cell transistors. The first material layers 21 may have the same or different thickness according to use. The second material layers 22 may be an insulating layer electrically separating stacked conductive layers 21. The uppermost second material layer 22 may have a greater thickness than other second material layers 22.

The first material layers 21 may be formed of a material having a greater etching selectivity than the second material layers 22. For example, the first material layers 21 may be formed of a sacrificial layer having a nitride, and the second material layers 22 may be formed of an insulating layer having an oxide. Alternatively, the first material layers 21 may be formed of a conductive layer including poly-silicon, and the second material layers 22 may be formed of an insulating layers having an oxide. Alternatively, the first material layers 21 may be formed of a conductive layer having doped poly-silicon, doped amorphous silicon, etc., and the second material layers 22 may be formed of a sacrificial layer having undoped poly-silicon, undoped amorphous silicon, etc. The following description of exemplary embodiments concerns the case in which the first material layers 21 are formed of a sacrificial layer, and the second material layers 22 are formed of an insulating layer.

A first opening part OP1 may be formed at least partially passing through the first material layers 21 and the second material layers 22. Here, the first opening part OP1 may be provided for defining regions of a sub-gate and a channel layer of a selection transistor. Thus, a width (or diameter) W1 of the first opening part OP1 may be determined considering thickness and properties of the sub-gate and the channel layer. The first opening part OP1 may be formed with depth to expose the first material layers 21 for a selection transistor gate. The first opening part OP1 may have a hole shape having a circular cross-section, an elliptical cross-section, a square cross-section, a polygonal cross-section, etc.

For example, after a mask pattern 23 may be formed on top of the first material layers 21 and the second material layers 22, the first material layers 21 and the second material layers 22 may be etched using the mask pattern 23 as an etch barrier, and thus the first opening part OP1 is formed.

Figure 2B:
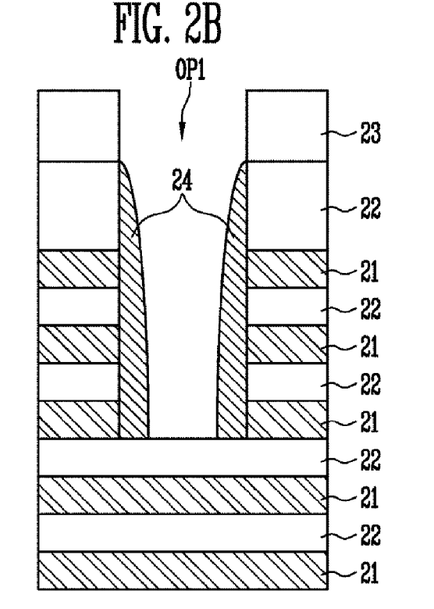

As shown in FIG. 2B, a conductive pattern 24 may be formed on the inner wall of first opening part OP1. For example, after a first conductive layer may be formed according to an entire surface of a first opening part OP1, the first conductive pattern 24 may be formed by a blanket etching process. According to this process, the first conductive pattern 24 may be formed with a shape of a spacer having a width that tapers toward the top.

The first conductive pattern 24 may be formed of a material having a greater etch selectivity than first material layers 21 and second material layers 22. For example, when the first material layers 21 may be formed of an oxide layer, the second material layers 22 may be formed of a nitride layer, and the first conductive pattern 24 may be formed of a poly-silicon layer. In addition to this, the first conductive pattern 24 may be formed to have various materials such as a metal layer, a silicide layer, a graphene layer, etc.

Figure 2C:
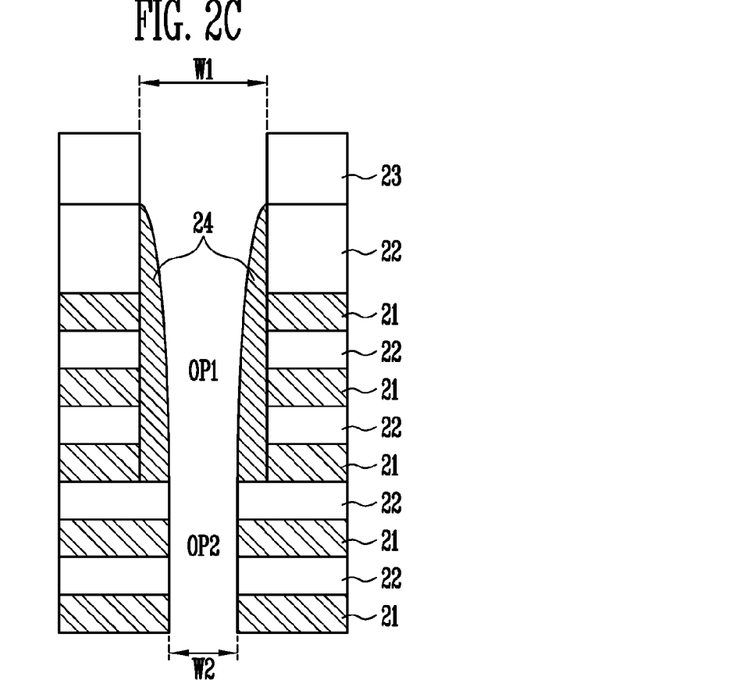

As shown in FIG. 2C, a second opening part OP2 which is extended from a bottom of the first opening part OP1 and passes through the first material layers 21 and the second material layers 22 is formed. The second opening part OP2 may be provided for defining a region of a channel layer of memory cell transistors, and may be formed with a smaller width W2 than the first opening part OP1.

For example, the first material layers 21 and the second material layers 22 may be etched using a mask pattern 23 and the first conductive pattern 24 as an etch barrier, and thus the second opening part OP2 may be formed.

Figure 2D:
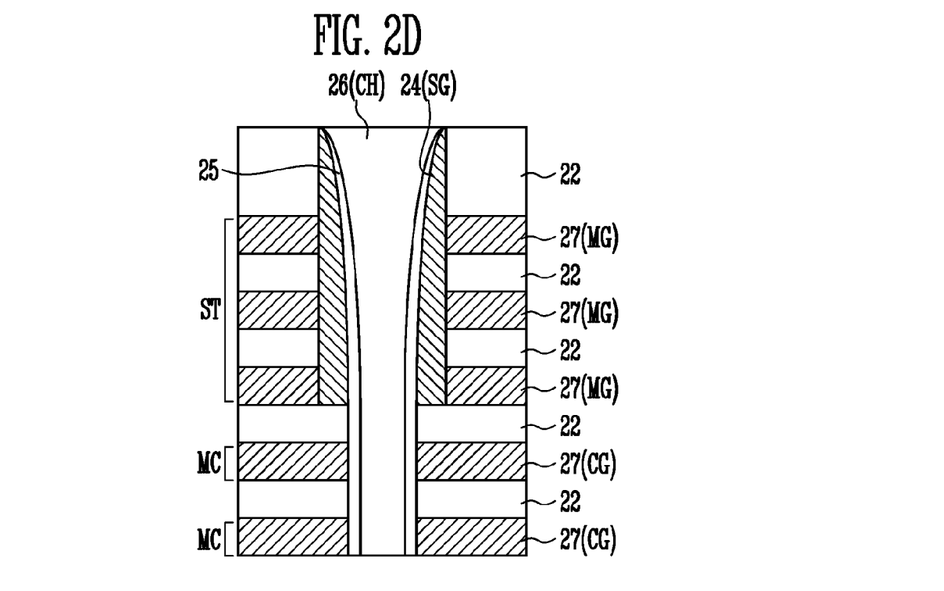

As shown in FIG. 2D, a gate insulating layer 25 may be formed on the inner wall of the first opening part OP1 and the second opening part OP2. For example, the gate insulating layer 25 may be an oxide layer or a memory layer, etc. If the memory layer may be used as the gate insulating layer 25, the memory layer may include at least one of a tunnel insulating layer, a data storage layer and a charge blocking layer. The data storage layer may include at least one of a floating gate including poly-silicon, etc., an electric charge trap layer having a nitride layer, etc., a nano-dot, and a phase change material layer.

In addition, a pillar 26 may be formed to be filled in the first opening part OP1 and the second opening part OP2 in which the gate insulating layer 25 is formed. The pillar 26 may be a semiconductor pattern, a conductive pattern, etc., and may be used as a channel layer or a vertical electrode layer, etc. For example, the pillar 26 may be formed to have a filled-in center or a hollow center, and an insulating layer may be formed in the hollow center region. The pillar 26 may have a shape whose width increases toward the top.

At least one slit (not shown in FIG. 2D) passing through the first material layers 21 and the second material layer 22 may be formed. The first material layers 21 exposed by the slit are selectively removed using the etching selectivity between the first material layers 21 and the second material layer 22 thereby forming grooves (not shown). A conductive material may be formed to be filled in the grooves, thus second conductive patterns 27 are formed in the grooves. The uppermost at least one second conductive pattern 27 of the second conductive patterns 27 may be used as a gate of a selection transistor, and other second conductive patterns 27 may be used as gates of memory cell transistors.

Here, the second conductive patterns 27 may be formed of different materials from first conductive patterns 24. For example, the first conductive patterns 24 may be formed of a poly-silicon layer, and the second conductive patterns 27 may be formed of a metal layer such as tungsten, etc.

For reference, before the second conductive patterns 27 are formed, an additional gate insulating layer (not shown in FIG. 2d) may be formed in the grooves. Here, the gate insulating layer may be a memory layer having at least one of a tunnel insulating layer, a data storage layer and a charge blocking layer.

Hereby, a selection transistor ST having alternately stacked insulating layers 22 and main gates MG, the first opening part OP1 passing through the insulating layers 22 and the main gates MG, a sub-gate SG formed in the first opening part OP1 and electrically connecting the plurality of main gates MG, and a channel layer 26 formed in the first opening part OP1, is formed.

Also, memory cells MC having alternately stacked insulating layers 22 and control gates CG, a second opening part OP2 passing through the insulating layers 22 and the control gates CG, and the channel layer CH formed in the second opening part OP2, are formed.

Meanwhile, the manufacturing method described above may be modified. As an example, the first material layers 21 may be formed of conductive layers, and the second material layers 22 may be formed of insulating layers. In this case, a process of forming grooves may be omitted and the first material layers 21 exposed by the slit become silicide layers. According to an embodiment, the first material layers 21 may be formed of conductive layers and the second material layers 22 may be formed of sacrificial layers. In this case, after the second material layers 22 are removed, instead of the first material layers 21, and then the grooves are formed, the insulating layer is formed in the grooves. At this time, an air gap may be formed in the grooves. The memory layer which is exposed through the grooves may be etched and then the memory layers of memory cells which are stacked may be separated from each other.

According to the manufacturing method described above, using the alternately stacked first material layers 21 and second material layers 22, a transistor can be formed easily. The first conductive pattern 24 used as an etch barrier in the manufacturing process remains and may be used as the sub-gate SG of the transistor.

Figure 3A:
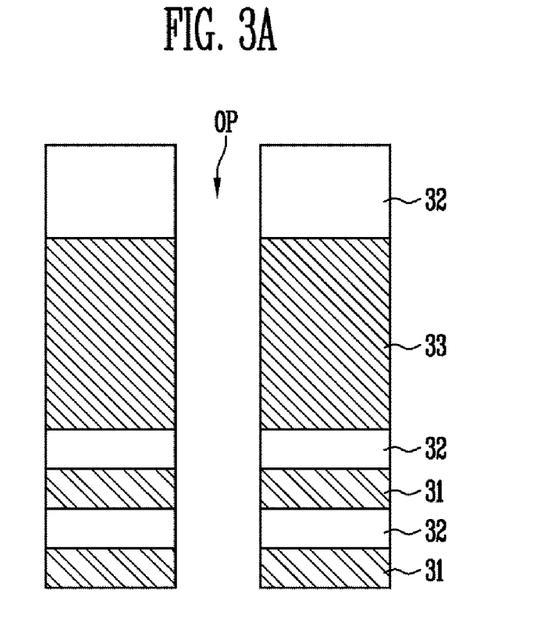
FIGS. 3A to 3C are cross-sectional views for describing a method of manufacturing a semiconductor device having a transistor in accordance with embodiments of the present invention.

As shown in FIG. 3A, a plurality of first material layers 31 and a plurality of second material layers 32 are alternately formed. The first material layers 31 may be conductive layers for gates, for example, gates of memory cell transistors, and the second material layers 32 form an insulating layer electrically separating stacked conductive layers.

The first material layers 31 may be formed of a material having a greater etch selectivity than the second material layers 32. For example, the first material layers 31 may be formed of a sacrificial layer having a nitride, and the second material layers 32 may be formed of an insulating layer having an oxide. Alternatively, the first material layers 31 may be formed of a conductive layer including poly-silicon, and the second material layers 32 may be formed of an insulating layer having an oxide. Alternatively, the first material layers 31 may be formed of a conductive layer having doped poly-silicon, doped amorphous silicon, etc., and the second material layers 32 may be formed of a sacrificial layer having undoped poly-silicon, undoped amorphous silicon, etc. The following description of exemplary embodiments relates to the case in which the first material layers 31 are formed of sacrificial layers, and the second material layers 32 are formed of insulating layers.

At least one first conductive layer 33 and at least one second material layer 32 may be alternately formed on top of the first material layers 31 and the second material layers 32. The first conductive layer 33 may be a material for forming a gate, for example, a gate of a selection transistor. The first conductive layer 33 may be formed with a thicker than the first material layers 31. For example, the first conductive layer 33 may be formed with 1.5 to 5 times thicker than the first material layers 31.

The first conductive layer 33 may be formed of a material having a greater etching selectivity than the first material layers 31 and the second material layers 32. For example, when the first material layers 31 may be formed of oxide layers and the second material layers 32 are formed of nitride layers, the first conductive layer 33 may be formed of a poly-silicon layer. Alternatively, the first conductive layer 33 may be formed to have various materials such as a metal layer, a silicide layer, graphene, etc.

An opening part OP may be formed passing through the first material layers 31, the second material layers 32 and the first conductive layer 33. Here, the opening part OP may have a hole shape having a circular cross-section, an elliptical cross-section, a square cross-section, a polygonal cross-section, etc.

Figure 3B:
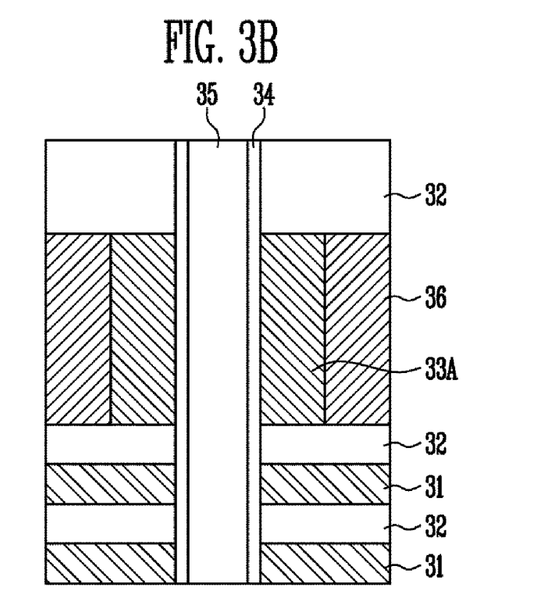

As shown in FIG. 3B, a gate insulating layer 34 may be formed on an inner wall of the opening part OP. For example, the gate insulating layer 34 may be an oxide layer or a memory layer, etc. If the memory layer may be used as the gate insulating layer 34, the memory layer may include at least one of a tunnel insulating layer, a data storage layer and a charge blocking layer. Also, the data storage layer may include at least one of a floating gate including poly-silicon, etc., an electric charge trap layer having a nitride layer, etc., a nano-dot, and a phase change material layer.

A pillar 35 may be formed in the opening part OP in which the gate insulating layer 34 is formed. The pillar 35 may be a semiconductor pattern, a conductive pattern, etc., and may be used as a channel layer, a vertical electrode layer, etc. For example, the pillar 35 may be formed to have a filled-in center or a hollow center, and an insulating layer may be formed in the hollow center region.

At least one slit (not shown in FIG. 3B) passing through the first material layers 31, the second material layers 32 and the first conductive layer 33 may be formed. In addition, the first conductive layer 33 exposed by the slit may be selectively etched. Here, the first conductive layer 33 may be partially etched to form a first conductive pattern 33A. In addition, a second conductive layer 36 may be formed in the etching region in which the first conductive layer 33 is partially removed. Here, the second conductive layer 36 may be formed of a different kind of material from the first conductive pattern 33A. For example, the first conductive pattern 33A may be formed of a poly-silicon layer, and the second conductive layer 36 may be formed of a metal layer such as tungsten, etc.

The second conductive layer 36 may have a shape covering a sidewall of the first conductive pattern 33A, and the first conductive pattern 33A and the second conductive layer 36 may be used as a gate of a selection transistor. Then, a transistor may be formed having the first conductive pattern 33A and the second conductive layer 36, in which a gate electrode is a different material.

Figure 3C:
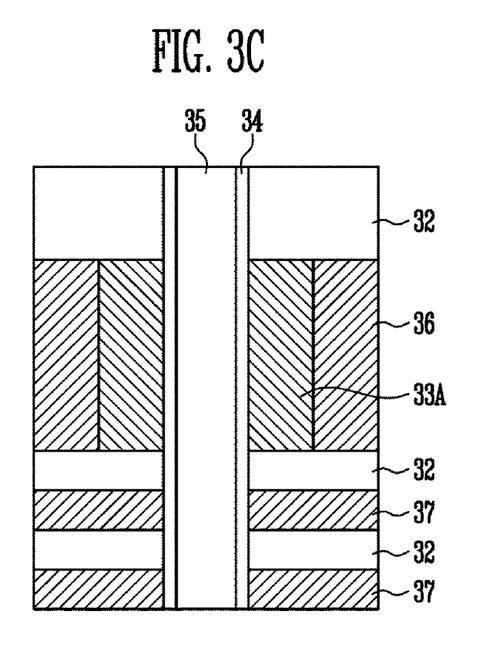

As shown in FIG. 3C, the first material layers 31 are selectively removed by the slits, grooves (not shown) are formed in an area in which the first material layers 31 is removed, and then third conductive layers 37 are formed in the grooves. For example, the third conductive layers 37 may be formed of metal layers such as tungsten layers, etc. Here, the third conductive layers 37 may be used gates of memory cell transistors. Before the third conductive layers 37 are formed, a gate insulating layer may be additionally formed.

For reference, the order of steps of the above-described manufacturing process may be changed. For example, after the first conductive pattern 33A is formed and the first material layers 31 are removed, the second conductive layer 36 and the third conductive layers 37 may be formed at the same time. Alternatively, after the first material layers 31 are removed and the third conductive layers 37 are formed, the first conductive pattern 33A and the second conductive layer 36 may be formed.

According to the manufacturing method described above, since the second conductive layer 36 is formed of a different material from the first material layers 21 and the second material layers 22, a channel length of a selection transistor can be easily adjusted. In other words, as the channel length of the selection transistor is increased beyond that of a memory cell transistor, a swing property of the selection transistor can be improved.

Figure 4A:
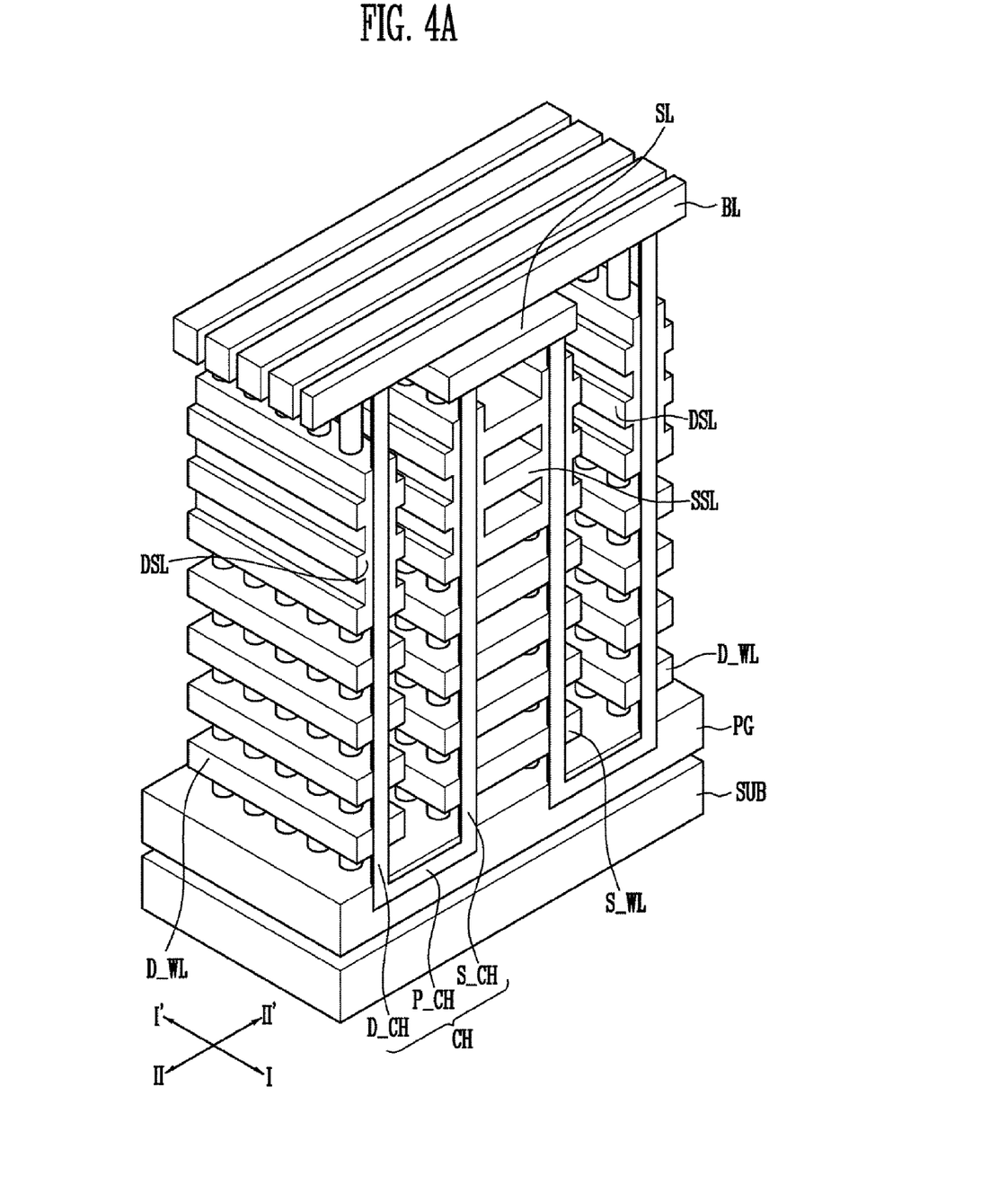
FIGS. 4A and 4B are perspective views of a semiconductor device in accordance with embodiments of the present invention.

As shown in FIG. 4A, a semiconductor device may include channel layers CH arranged in a first direction I-I' and a second direction II-II' crossing the first direction I-I', in the shape of a substantially "U", a substantially "W", etc. Here, the channel layers CH may include a pipe channel layer P_CH, and a source-side channel layer S_CH and a drain-side channel layer D_CH connected to the pipe channel layer P_CH. While FIG. 4A shows the channel layers CH arranged in a matrix, the channel layers CH may be alternately arranged in a zigzag shape to increase integration. In the FIG. 4A and FIG. 4B, for convenience of description, an insulating layer is omitted.

The semiconductor device may include alternately stacked conductive layers and insulating layers on a substrate SUB. Here, the conductive layers may include a pipe gate PG, source-side word lines S_WL, drain-side word lines D_WL, source selection lines SSL and drain selection lines DSL. The pipe gate PG, the source-side word lines S_WL and the drain-side word lines D_WL, and the source selection lines SSL and the drain selection lines DSL, are stacked to surround the channel layer CH. For example, the pipe gate PG may be formed to wrap around the pipe channel layer P_CH. The source-side word lines S_WL and the source selection lines SSL are stacked with surrounding at least one column of the source-side channel layer S_CH, and the drain-side word lines D_WL and the drain selection lines DSL are stacked to surround at least one column of the drain-side channel layers D_CH.

In particular, the source selection lines SSL may include main gates stacked with surrounding the source-side channel layer S_CH, and a sub-gate connecting the main gates. The drain selection lines DSL may include main gates stacked with surrounding the drain-side channel layer D_CH, and a sub-gate connecting the main gates.

Further, the semiconductor device may include a memory layer (not shown in FIG. 4A) interposed between the channel layers CH, and the source-side word lines S_WL and the drain-side word lines D_WL. The memory layer may include a tunnel insulating layer, a data storage layer and a charge blocking layer. For example, the data storage layer includes a trap layer such as a nitride layer, etc., a floating gate such as a poly-silicon layer, etc., a nano-dot, a phase change material layer, etc.

Further, the semiconductor device may include a source line SL connected to source-side channel layers S_CH, and bit lines BL connected to the drain-side channel layers D_CH. Here, the source line SL and the bit lines BL may extend in mutually orthogonal directions.

According to the structure described above, a drain selection transistor DST may be formed in a cross region between the channel layer CH and the drain selection lines DSL. A source selection transistor SST may be formed in a cross region between the channel layer CH and the source selection lines SSL cross. A plurality of memory cells MC may be formed in cross regions where the channel layer CH, and the source-side word lines S_WL and the drain-side word lines D_WL cross, respectively. Therefore, at least one drain selection transistor connected in series, the plurality of memory cells, at least one pipe transistor and at least one source selection transistor may configure one string, and strings may be arranged in a "U" shape.

Figure 4B:
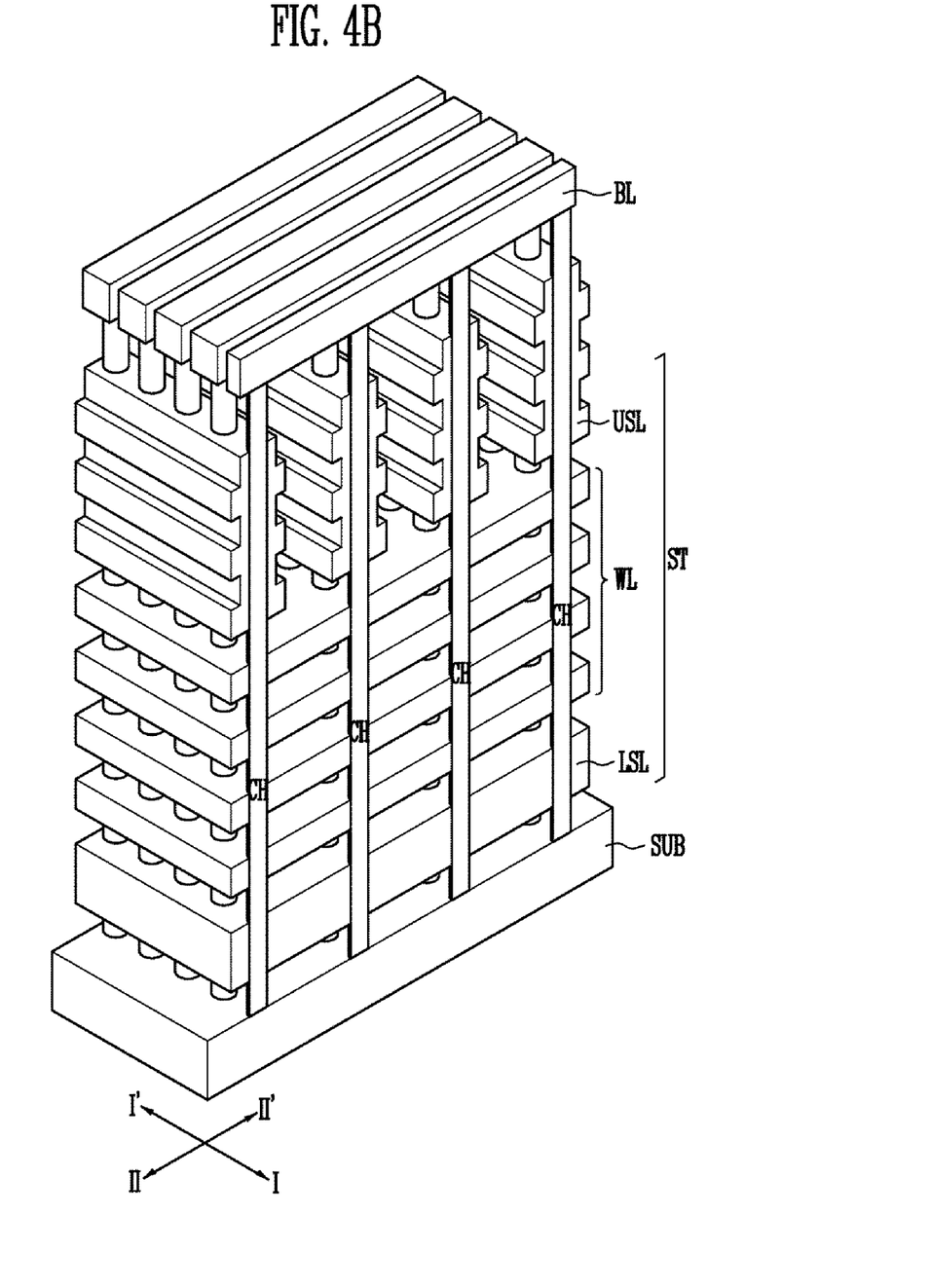

As shown in FIG. 4B, the semiconductor device may include channel layers CH protruded from a substrate SUB having a source region (not shown in FIG. 4B). The channel layers may be arranged in a first direction I-I' and a second direction II-II', respectively. FIG. 4B shows the channel layers CH arranged in a matrix, but the channel layers CH may be alternately arranged in a zigzag shape to increase integration.

The semiconductor device may include alternately stacked insulating layers and conductive layers on the substrate SUB. Here, the conductive layers may include a lower selection layer LSL, word lines WL, and upper selection lines USL. The lower selection line LSL, the word lines WL, and the upper selection lines USL are stacked with surrounding at least one channel column, and according to a driving method, the conductive layers may be shaped as plates or lines extending in the first direction I-I'.

In particular, the upper selection line USL and the lower selection line LSL include main gates which are stacked with surrounding the channel layers CH, and a sub-gate connecting the main gates.

Further, the semiconductor device may include a memory layer (not shown in FIG. 4B) interposed between the channel layers CH and the word lines WL. The memory layer may include a tunnel insulating layer, a data storage layer and a charge blocking layer. For example, the data storage layer includes a trap layer such as a nitride layer, etc., a floating gate such as a poly-silicon layer, etc., a nano-dot, a phase change material layer, etc.

Further, the semiconductor device may include bit lines BL connected to the channel layers CH. For example, the bit lines BL may extend in the second direction II-II'.

According to this structure, at least one lower selection transistor may be connected in series, a plurality of memory cells and at least one upper selection transistor configure one string, and the strings are vertically arranged.

While the embodiments described above relate to a 3-dimensional semiconductor device in which memory cells are stacked, embodiments of the present invention are not limited by the above description. In alternative embodiments of the present invention, the memory cells may be applied to a 2-dimensionally arranged planar semiconductor device, etc., and to various electronic devices having transistors, such as a volatile memory device, a non-volatile memory device, etc.

Figure 5:
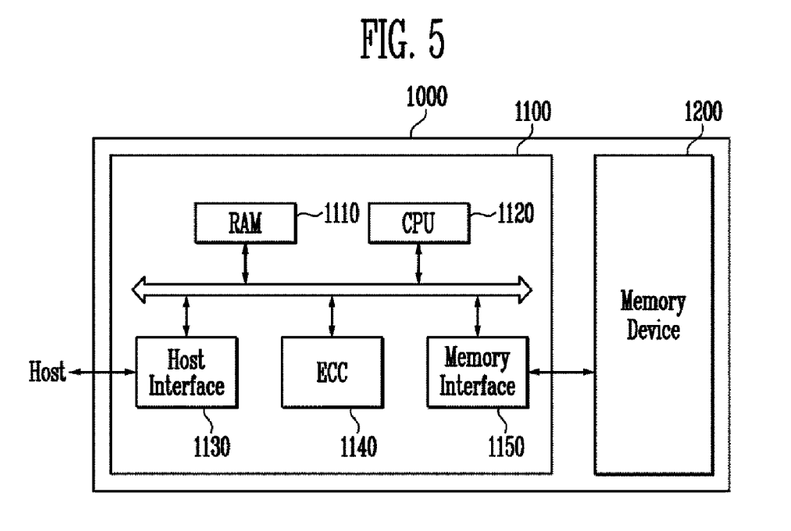
FIG. 5 is a block diagram illustrating a configuration of a memory system in accordance with embodiments of the present invention.

As shown in FIG. 5, a memory system 1000 may include a memory device 1200 and a controller 1100.

The memory device 1200 is used to store various types of data such as text, graphics, software code, etc. The memory device 1200 may be a non-volatile memory and the semiconductor device described above with reference to FIGS. 2a to 4b.

The controller 1100 may be connected to a host and the memory device 1200 and may be configured to access the memory device 1200 in response to a request from the host. For example, the controller 1100 may be configured to control read, write, erase and background operations, etc., of the memory device 1200.

The controller 1100 may include a RAM (Random Access Memory) 1110, a CPU (Central Processing Unit) 1120, a host interface 1130, an ECC (Error Correction Code) circuit 1140, a memory interface 1150, etc.

Here, the RAM 1110 may be used as an operation memory, a cache memory between the memory device 1200 and the host, and a buffer memory between the memory device 1200 and the host. For reference, the RAM 1110 may be replaced by an SRAM (Static Random Access Memory), a ROM (Read Only Memory), etc.

The CPU 1120 is configured to control overall operation of the controller 1100. For example, the CPU 1120 is configured to operate firmware such as an FTL (Flash Translation Layer) stored in the RAM 1110.

The host interface 1130 may be configured to perform interfacing with the host. For example, the controller 1100 communicates with the host through at least one of various protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, IDE (Integrated Drive Electronics) protocol, private protocol, etc.

The ECC circuit 1140 may be configured to detect and correct errors in data read from the memory device 1200 using the ECC.

The memory interface 1150 may be configured to perform interfacing with the memory device 1200. For example, the memory interface 1150 may include a NAND interface or a NOR interface.

For reference, the controller 1100 may further include a buffer memory (not shown in FIG. 5) in order to store data temporarily. Here, the buffer memory may be used to temporarily store data delivered to outside through the host interface 1130, or to temporarily store data delivered from the memory device 1200 through the memory interface 1150. Also, the controller 1100 further includes a ROM to store code data for interfacing with the host.

For example, the memory device 1200 and the controller 1100 may include a pillar, a gate electrode having a first conductive pattern surrounding the pillar and a plurality of second conductive patterns which protrude and are arranged to be spaced apart from the first conductive pattern, and a transistor having an insulating pattern interposed between the pillar and the first conductive pattern. Since a structure and a manufacturing method of a transistor are the same as described above, a detailed description thereof will be omitted.

Since the memory system 1000 includes a transistor having improved properties, the properties of the memory system 1000 can also be improved.

Figure 6:
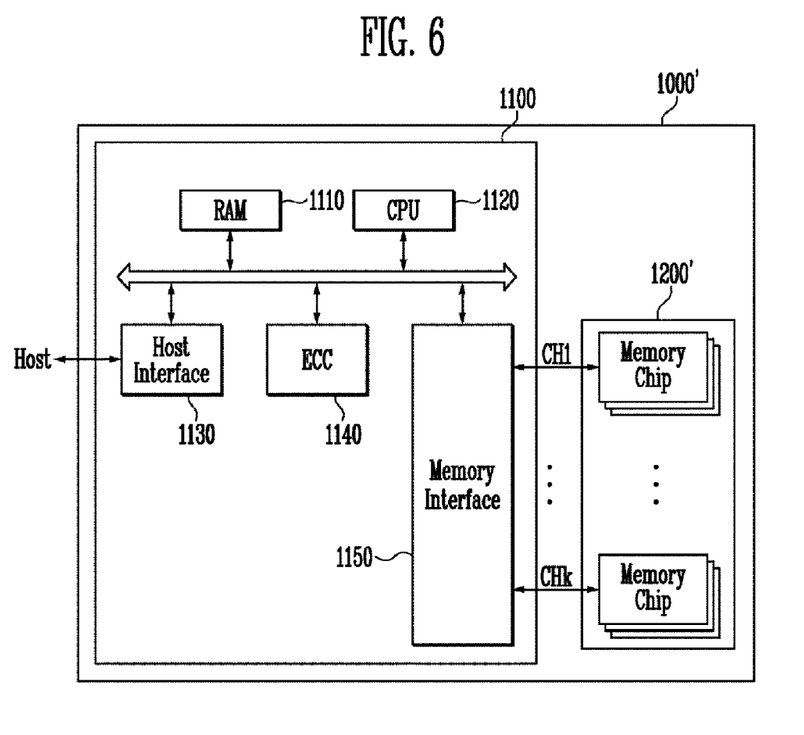
FIG. 6 is a block diagram illustrating a configuration of a memory system in accordance with embodiments of the present invention.

FIG. 6 is a block diagram illustrating a configuration of a memory system in accordance with embodiments of the present invention. Content that has already been described above will be omitted from the following description.

As shown in FIG. 6, according to an embodiment of the present invention, a memory system 1000' includes a memory device 1200' and a controller 1100. The controller 1100 includes a RAM 1110, a CPU 1120, a host interface 1130, an ECC circuit 1140, a memory interface 1150, etc.

The memory device 1200' may be a non-volatile memory and the semiconductor device described above with reference to FIGS. 2A to 4B. The memory device 1200' may be a multi-chip package configured by a plurality of the memory chips. The plurality of memory chips are divided into a plurality of groups, and the plurality of groups are configured to communicate with the controller 1100 through a first channel to a k-th channel CH1 to CHk. The memory chips belonging to one group are configured to communicate with the controller 1100 through a common channel. For reference, the memory system 1000' may be transformed to connect one channel to one memory chip.

The memory device 1200', the controller 1100, etc., include a pillar, a gate electrode having a first conductive pattern surrounding the pillar and a plurality of second conductive patterns which protrude and are arranged to be spaced apart from the first conductive pattern, and a transistor having an insulating pattern interposed between the pillar and the first conductive pattern. The structure and manufacturing method of the transistor are the same as described above and thus a detailed description thereof will be omitted.

According to an embodiment of the present invention, since the memory system 1000' may include a transistor with improved properties, the properties of the memory system 1000' can also be improved. In particular, by configuring the memory device 1200' as a multi-chip package, data storage capacity of the memory system 1000' can be increased and driving speed can be improved.

Figure 7:
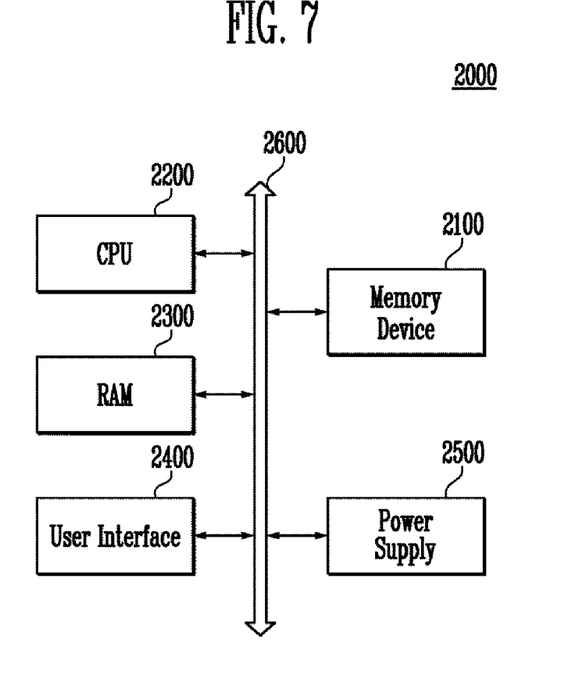
FIG. 7 is a block diagram illustrating a configuration of a computer system in accordance with embodiments of the present invention.

FIG. 7 is a block diagram illustrating a configuration of a computer system in accordance with embodiments of the present invention. Content that has already been described above will be omitted from the following description.

As shown in FIG. 7, a computer system 2000 may include a memory device 2100, a CPU 2200, a RAM 2300, a user interface 2400, a power supply 2500 and a system bus 2600.

The memory device 2100 may store data provided through the user interface 2400, data processed by the CPU 2200, etc. The memory device 2100 is electrically connected to the CPU 2200, the RAM 2300, the user interface 2400, the power supply 2500, etc., through the system bus 2600. For example, the memory device 2100 may be connected to the system bus 2600 through a controller (not shown in FIG. 7) or is directly connected to the system bus 2600. When the memory device 2100 may be directly connected to the system bus 2600, a function of the controller is performed by the CPU 2200, the RAM 2300, etc.

Here, the memory device 2100 may be a non-volatile memory and the semiconductor device described above with reference to FIGS. 2A to 4B. The memory device 2100 may be a multi-chip package configured by a plurality of memory chips as described with reference to FIG. 6.

The computer system 2000 having such a configuration may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, etc.

The memory device 2100 and the CPU 2200 may include a pillar, a gate electrode having a first conductive pattern surrounding the pillar and a plurality of second conductive patterns which protrude and are arranged to be spaced apart from the first conductive pattern, and a transistor having an insulating pattern interposed between the pillar and the first conductive pattern. The structure and manufacturing method of the transistor are the same as described above, so a detailed description thereof will be omitted.

Since the computer system 2000 includes a transistor with improved properties, the properties of the computer system 2000 can also be improved.

Figure 8:
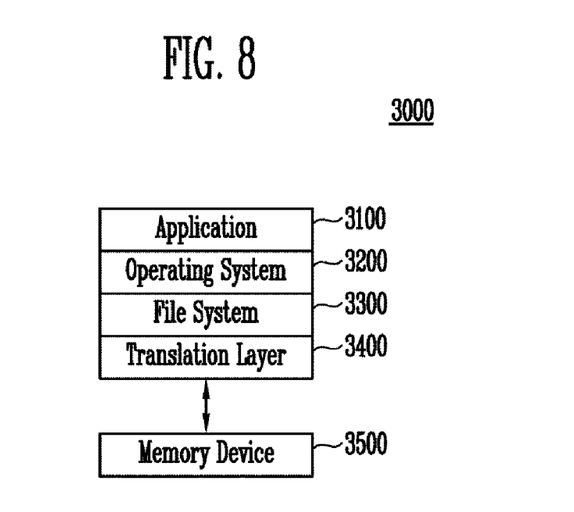
FIG. 8 is a block diagram illustrating a computer system in accordance with embodiments of the present invention.

FIG. 8 is a block diagram illustrating a computer system in accordance with embodiments of the present invention.

As shown in FIG. 8, according to an embodiment of the present invention, a computer system 3000 may include a software layer having an operating system 3200, an application 3100, a file system 3300, a translate layer 3400, etc., and a hardware layer such as a memory device 3500, etc.

The operating system 3200 may manage software resources and hardware resources of the computer system 3000 and controls program execution by the CPU. The application 3100 may be various application programs executed in the computer system 3000, and may be a utility performed by the operating system 3200.

The file system 3300 may mean a logical structure to manage data, files, etc., existing in the computer system 3000, and it organizes files or data stored in the memory device 3500 according to rules. The file system 3300 may be determined by the operating system 3200 used in the computer system 3000. For example, when the operating system 3200 is Microsoft Windows, the file system 3300 may be FAT (File Allocation Table), NTFS (NT File System), etc., and when the operating system 3200 is Unix/Linux, the file system 3300 may be EXT (Extended File System), UFS (Unix File System), JFS (Journaling File System), etc.

In FIG. 8, the operating system 3200, the application 3100 and a file system 3300 are shown as separate blocks, but the application 3100 and the file system 3300 may be included in the operating system 3200.

The translation layer 3400 may translate an address into an appropriate type for the memory device 3500 in response to a request from the file system 3300. For example, the translation layer 3400 may translate a logical address created by the file system 3300 into a physical address of the memory device 3500. Here, mapping information of the logical address and the physical address may be stored in an address translation table. For example, the translation layer 3400 may be an FTL (Flash Translation Layer), a ULL (Universal Flash Storage Link Layer), etc.

The memory device 3500 may be a non-volatile memory and a semiconductor device described above with reference to FIGS. 2A to 4B.

The computer system 3000 having this configuration may be separated by an operating system layer performed in the upper level region and a controller layer performed in the lower level region. Here, the application 3100, the operating system 3200 and the file system 3300 may be included in the operating system layer and may be driven by an operating memory of the computer system 3000. The translation layer 3400 may be included in the operating system layer or in the controller layer.

Hardware such as the memory device 3500, etc., includes a pillar, a gate electrode having a first conductive pattern surrounding the pillar and a plurality of second conductive patterns which protrude and are arranged to be spaced apart from the first conductive pattern, and a transistor having an insulating pattern interposed between the pillar and the first conductive pattern. The structure and manufacturing method of the transistor are the same as described above, so a detailed description thereof will be omitted.

Since the computer system 3000 includes a transistor with improved properties, the properties of the computer system 3000 can also be improved.

A transistor may include stacked main gates and a sub-gate connecting the stacked main gates. Therefore, a channel layer between the stacked main gates can be controlled easily through the sub-gate and a swing property of the transistor can be improved. Trapping of electric charge in gate insulating layer between the stacked main gates can be prevented.

In the drawings and detailed description, typical exemplary embodiments of the invention are disclosed, and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A transistor, comprising:
   a pillar;
   a gate electrode having a first conductive pattern surrounding the pillar and a plurality of second conductive patterns electrically coupled to the first conductive pattern, wherein the plurality of second conductive patterns protrude from the first conductive pattern and are arranged to be spaced apart from each other; and
   an insulating pattern interposed between the pillar and the first conductive pattern.

2. The transistor of claim 1, wherein a material of the first conductive pattern is different from that of the second conductive patterns.

3. The transistor of claim 1, wherein the first conductive pattern includes silicon, and the second conductive patterns include a metal.

4. A transistor, comprising:
   a plurality of stacked main gates having an opening part configured to pass through the plurality of main gates;
   a sub-gate formed in the opening part and configured to be electrically coupled to the plurality of main gates; and
   a channel layer formed in the opening part.

5. The transistor of claim 4, further comprising:
   a gate insulating layer interposed between the channel layer and the sub-gate.

6. The transistor of claim 5, wherein the gate insulating layer includes a tunnel insulating layer, a data storage layer, and a charge blocking layer.

7. The transistor of claim 4, wherein the sub-gate is configured to include a spacer shape.

8. The transistor of claim 4, wherein a material of the main gates is different from that of the sub-gate.

9. The transistor of claim 4, wherein the main gates include a metal and the sub-gate includes silicon.

10. A semiconductor device, comprising:
- a plurality of stacked first conductive layers having a first opening part configured to pass through the plurality of first conductive layers;
- a pillar formed in the first opening part; and
- a second conductive layer formed in the first opening part with surrounding the pillar, and configured to be electrically coupled to the plurality of first conductive layers.

11. The semiconductor device of claim 10, further comprising:
- a gate insulating layer interposed between the pillar and the second conductive layer.

12. The semiconductor device of claim 10, wherein the second conductive layer is configured to include a spacer shape.

13. The semiconductor device of claim 10, wherein a width of the pillar increases toward its top.

14. The semiconductor device of claim 10, wherein the first conductive layers include a metal, the second conductive layer includes silicon, and the pillar includes a semiconductor material.

15. The semiconductor device of claim 10, further comprising:
- a plurality of third conductive layers stacked above or below the first conductive layers with a second opening part configured to pass through the third conductive layers and having the pillar disposed therein.

16. The semiconductor device of claim 15, wherein the second opening part has a smaller width than the first opening part.

17. The semiconductor device of claim 15, further comprising:
- a gate insulating layer configured to surround the pillar and formed in the first and the second opening parts.

18. The semiconductor device of claim 17, wherein the gate insulating layer includes at least one of a tunnel insulating layer, a data storage layer and a charge blocking layer.

19. The semiconductor device of claim 10, wherein the first and second conductive layers are selection gates.

20. The semiconductor device of claim 19, wherein, during a program, read or erase operation, the same voltage is applied to the first and second conductive layers.

* * * * *